(12) United States Patent
Noda

(10) Patent No.: US 6,216,245 B1
(45) Date of Patent: Apr. 10, 2001

(54) ERROR CORRECTION CODING METHOD AND APPARATUS THEREOF, ERROR CORRECTION DECODING METHOD APPARATUS THEREOF, DATA RECORDING AND REPRODUCING APPARATUS, AND RECORDING MEDIUM

(75) Inventor: Chosaku Noda, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/163,205

(22) Filed: Sep. 30, 1998

(30) Foreign Application Priority Data

Sep. 30, 1997 (JP) .................................................. 9-267048

(51) Int. Cl.[7] .......................... G11B 20/18; G11B 20/12; H03M 13/00
(52) U.S. Cl. ............................................................ 714/755
(58) Field of Search .................................. 714/763, 758, 714/761, 762, 756, 701, 769, 755; 360/53; 369/275.3

(56) References Cited

U.S. PATENT DOCUMENTS

| 4,882,732 | * | 11/1989 | Kaminaga | 714/702 |
| 5,459,621 | * | 10/1995 | Tsuji et al. | 360/32 |
| 5,483,541 | | 1/1996 | Linsky . | |
| 5,732,088 | * | 3/1998 | Sako | 714/701 |
| 5,745,505 | * | 4/1998 | Yonemitsu et al. | 714/755 |
| 5,768,298 | * | 6/1998 | Nagai et al. | 714/769 |
| 6,041,029 | * | 3/2000 | Iida et al. | 369/50 |

FOREIGN PATENT DOCUMENTS

| 748 058 A2 | 12/1996 | (EP) . |
| 813 809 A1 | 12/1997 | (EP) . |
| 9-50677 | 2/1997 | (JP) . |

* cited by examiner

Primary Examiner—Albert Decady
Assistant Examiner—Shelly A Chase
(74) Attorney, Agent, or Firm—Pillsbury & Winthrop

(57) ABSTRACT

An error correction coding method comprises the steps of dividing data into first blocks with predetermined size, assigning the data to a plurality of channels and writing into the memory by making the first blocks a unit, performing a coding of at least two types of error correction codes for the data written into the memory for each channel in a second block unit constituted by a predetermined number of the first blocks and adding a check parity to generate a third block, reading the third block from the memory by adding a different offset for each of the plurality of channels, and multiplexing read the third block to a data series in a unit of a predetermined length.

18 Claims, 15 Drawing Sheets

W: WRITE PROCESSING   E: ERROR CORRECTION CODING PROCESSING
R: READ PROCESSING    IN BRACKETS, SECTOR NUMBER TO BE PROCESSING

| SECTOR NO. = | 51, 63, 75, 87 |
|---|---|
| | 100, 64, 76, 88 |
| | 101, 65, 77, 89 |
| | 102, 66, 78, 90 |
| | 103, 67, 79, 91 |
| | 104, 116, 80, 92 |
| | 105, 117, 81, 93 |
| | 106, 118, 82, 94 |
| | 107, 119, 83, 95 |
| | 108, 120, 132, 96 |
| | 109, 121, 133, 97 |
| | 110, 122, 134, 98 |
| | 111, 123, 135, 99 |
| | 112, 124, 136, 148 |
| | 113, 125, 137, 149 |
| | 114, 126, 138, 150 |
| | 115, 127, 139, 151 |
| | 164, 128, 140, 152 |
| | 165, 129, 141, 153 |
| | 166, 130, 142, 154 |
| | 167, 131, 143, 155 |
| | 168, 180, 144, 156 |
| | 169, 181, 145, 157 |
| | 170, 182, 146, 158 |
| | 171, 183, 147, 159 |
| | 172, 184, 196, 160 |
| | 173, 185, 197, 161 |
| | 174, 186, 198, 162 |
| | 175, 187, 199, 163 |
| | 176, 188, 200, 212 |

FIG. 9

| SECTOR NO. = | 52, 90, |
|---|---|
| | 83, 91 |
| | 100, 92 |
| | 101, 93 |
| | 102, 94 |
| | 103, 95 |
| | 104, 96 |
| | 105, 97 |
| | 106, 98 |
| | 107, 99 |
| | 108, 116 |
| | 109, 117 |
| | 110, 118 |
| | 111, 119 |
| | 112, 120 |
| | 113, 121 |
| | 114  122 |
| | 115, 123 |
| | 132, 124 |
| | 133, 125 |
| | 134, 126 |
| | 135, 127 |
| | 136, 128 |
| | 137, 129 |
| | 138, 130 |
| | 139, 131 |
| | 140, 196 |
| | 140, 196 |

FIG. 11

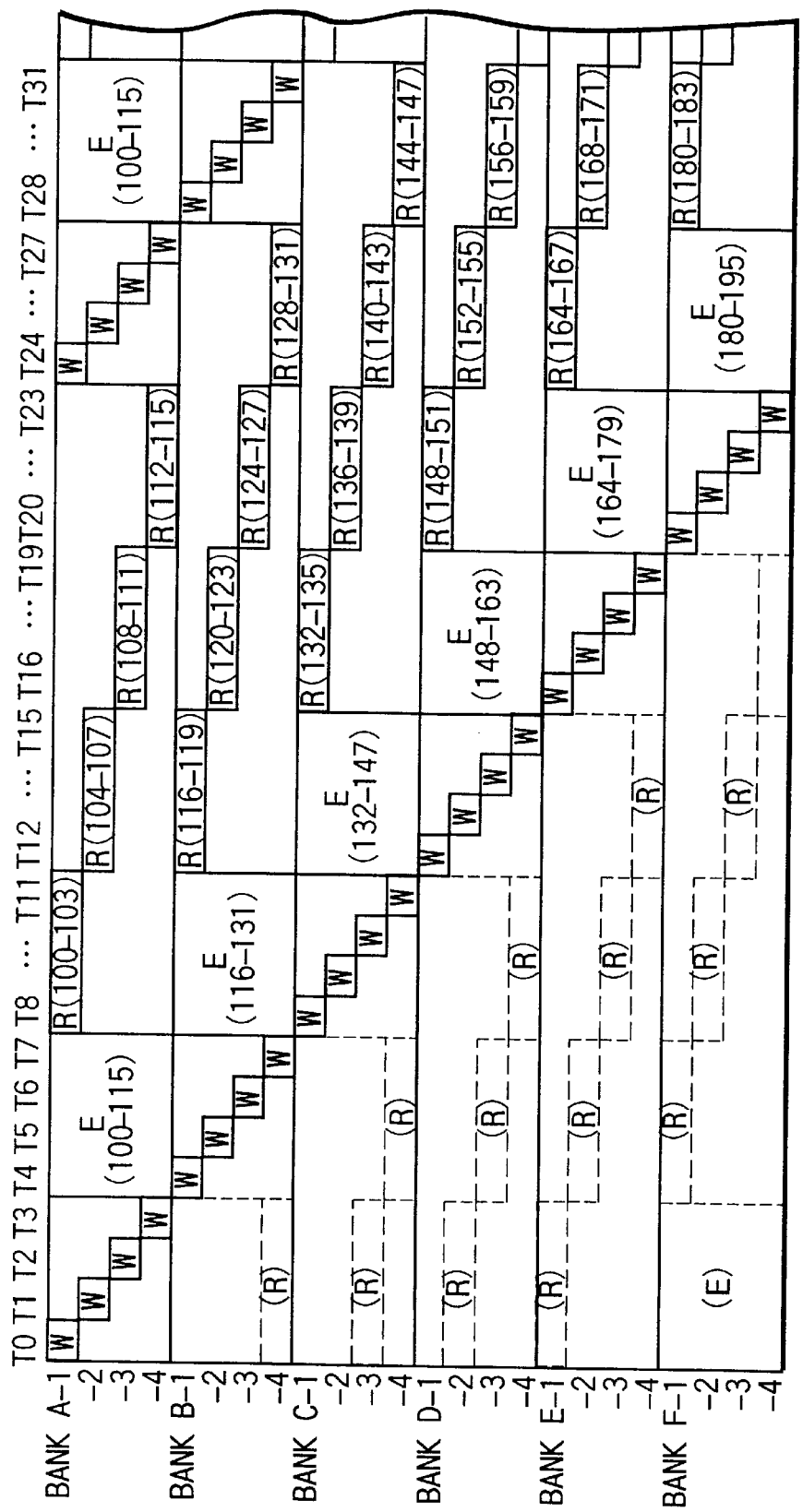

W: WRITE PROCESSING   E: ERROR CORRECTION CODING PROCESSING
R: READ PROCESSING    IN BRACKETS, SECTOR NUMBER TO BE PROCESSING

W: WRITE PROCESSING  E: ERROR CORRECTION CODING PROCESSING
R: READ PROCESSING  IN BRACKETS, SECTOR NUMBER TO BE PROCESSING

ERROR CORRECTION CODING METHOD AND APPARATUS THEREOF, ERROR CORRECTION DECODING METHOD APPARATUS THEREOF, DATA RECORDING AND REPRODUCING APPARATUS, AND RECORDING MEDIUM

BACKGROUND OF THE INVENTION

The present invention relates to a method of generating and processing data by an interleave method capable of processing with a few memories in a digital recording and reproducing system using an optical disk or the like, a medium recording the data, and a data recording apparatus and a reproducing apparatus.

A storage capacity for every unit area becomes high with an improvement of the high density recording technique in a digital recording and reproducing apparatus to record and reproduce to/from such as an optical disk, a magnetic disk, and a magnetic tape. On the other hand, in the digital recording and reproducing apparatus, an occurring error can be corrected by adding an error correction code to the recording data against the error generation of the data by the defect of the noise and the medium.

Since more errors occur even if an error rate by the lowering of a signal component becomes worse and the defect with the same size occurs to the medium when the recording density becomes high, it becomes necessary to realize the error correction code having higher correction ability. Especially, the dealing with the continued large error (burst error) which occurs with the defect of the medium becomes important.

To improve the burst error correction ability, in addition to the method of using an error correction code with the higher error correction ability, there is an interleave method. An "interleave" method is a method of multiplying a plurality of data in which an error correction coding is performed by rearranging the data and the data of the identical error correction code are dispersed in a wide range. Since the error occurred continuously on the recording data series is dispersed by a plurality of error correction codes when performing an interleave, the burst error correction ability becomes high.

Here, the product code of the Reed-Solomon code (RS code) is used as the error correction code and the example in which an interleave is performed in four blocks will be explained.

The input data is divided by predetermined data unit to arrange in two-dimensional form and constitute a data block. An outer code parity produced by the coding of the RS code to each column data in the data block. An inner code parity is produced by the coding of the RS code to each row data. As a result, the error correction block is constituted from data block, the outer code parity and the inner code parity.

The four error correction blocks are arranged in the side direction according to the number of the interleave blocks. FIG. 1 shows a arranged data. Next, data is taken out from this block for each line and after rearranging data according to the necessity, data is output as a recording data.

Next, FIGS. 2A and 2B show an example of the interleave processing when using a memory. A memory is composed of a plurality of banks capable of storing the error correction block.

The input data is once written into the memory. If an error correction coding to the continuing the input data is performed, the writing to the bank A is stored and data for the one data block to be coded is written until period T3 in period T0. When the writing to the bank A is completed, the error correction coding processing to the bank A data is started in period T4. At the same time, the writing of the input data to the bank B is changed. Hereinafter, the error correction coding processing and the writing to the memory is sequentially performed.

The data in which an error correction coding is performed is read from the memory according to the interleave method. To perform an interleave processing in four blocks, the data must be read from four banks in parallel. Therefore, the read processing from the memory can not be started after period T20 when an error correction coding for the four-bank data from bank A to D is completed. When starting the reading of the interleaved data from period T20, the reading ends at period T35. During the reading period, the error correction coding processing and the writing of the input data are performed by advancing the banks.

The memory from the banks A to D which reading is completed becomes reusable after period T36. After the writing to the bank 1 is completed, the data can be written into the bank A from period T36. Therefore, the number of the minimum memory banks of necessary interleave processing becomes nine.

When the interleave processing is performed by above procedure, the writing to the one bank, an error correction coding to one bank and a reading from four banks are performed in an identical period. Each processing can be processed at the time division. On the other hand, when taking notice of the processing of one bank, for example, in case of bank A, a series of processing from period T0 to period T35 is periodically performed. However, no processing is performed in the one-third period of the periodically performed processing period. When taking notice of the use state of the bank in the identical period, three banks are not always used because of the processing wait. Therefore, the use efficiency of the memory is not sufficient, as a result, a lot of memories are required to process the interleave.

As described above, in the conventional interleave method, the error correction block of the number according to the number of the interleaves is combined and data is replaced in the combined blocks and the interleave is employed to strengthen the burst error correction ability. Therefore, when realizing the interleave processing using the memory, there is a problem the use efficiency of the memory lowers since the period which performs no processing occurs, as the result, the storage capacity necessary to process an interleave increases.

BRIEF SUMMARY OF THE INVENTION

To solve above-mentioned problem, an object of the present invention is to improve the use efficiency of the memory when realizing the interleave processing using the memory.

Moreover, according to the present invention, data is divided into the predetermined size of data block and a data block is assigned to a plurality of channels as the unit. Then, a coding of at least two types of the error correction codes is performed every channel. The error correction block is constituted by the data block and the check parity generated by the coding processing, and is recorded to the recording medium after multiplying to the data series by adding a different offset for each of the plurality of channels. As a result, the storage capacity required by the interleave processing can be reduced.

According to the present invention, the data read from the recording medium is divided into the plurality of channels, and by adding the offset according to the channel number of the channels, the error correction block is generated. The error detection and correction is performed by decoding at least two types of error correction codes to the error correction block and reproduced data is output in order from each channel in a predetermined data block unit. The storage capacity which is necessary for the deinterleave processing can be reduced.

According to the present invention, to improve the error correction ability for the burst error occurred by the defect of the medium which is a problem when recording with high density, the memory for interleave in the recording device and the memory for deinterleave in the reproducing device can be used efficiently by adding the predetermined offset among the error correction blocks to be interleaved when performing the deinterleave processing among the plurality of error correction blocks. Therefore, the capacity of each memory which becomes necessary can be reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 9 shows a data series after the channel multiplexing in case of the four block interleave;

FIG. 11 shows a data series after the channel multiplexing in case of the two block interleave;

FIG. 12 shows interleave processing to the recording memory in case of the four block interleave;

DETAILED DESCRIPTION OF THE INVENTION

Figure 1:
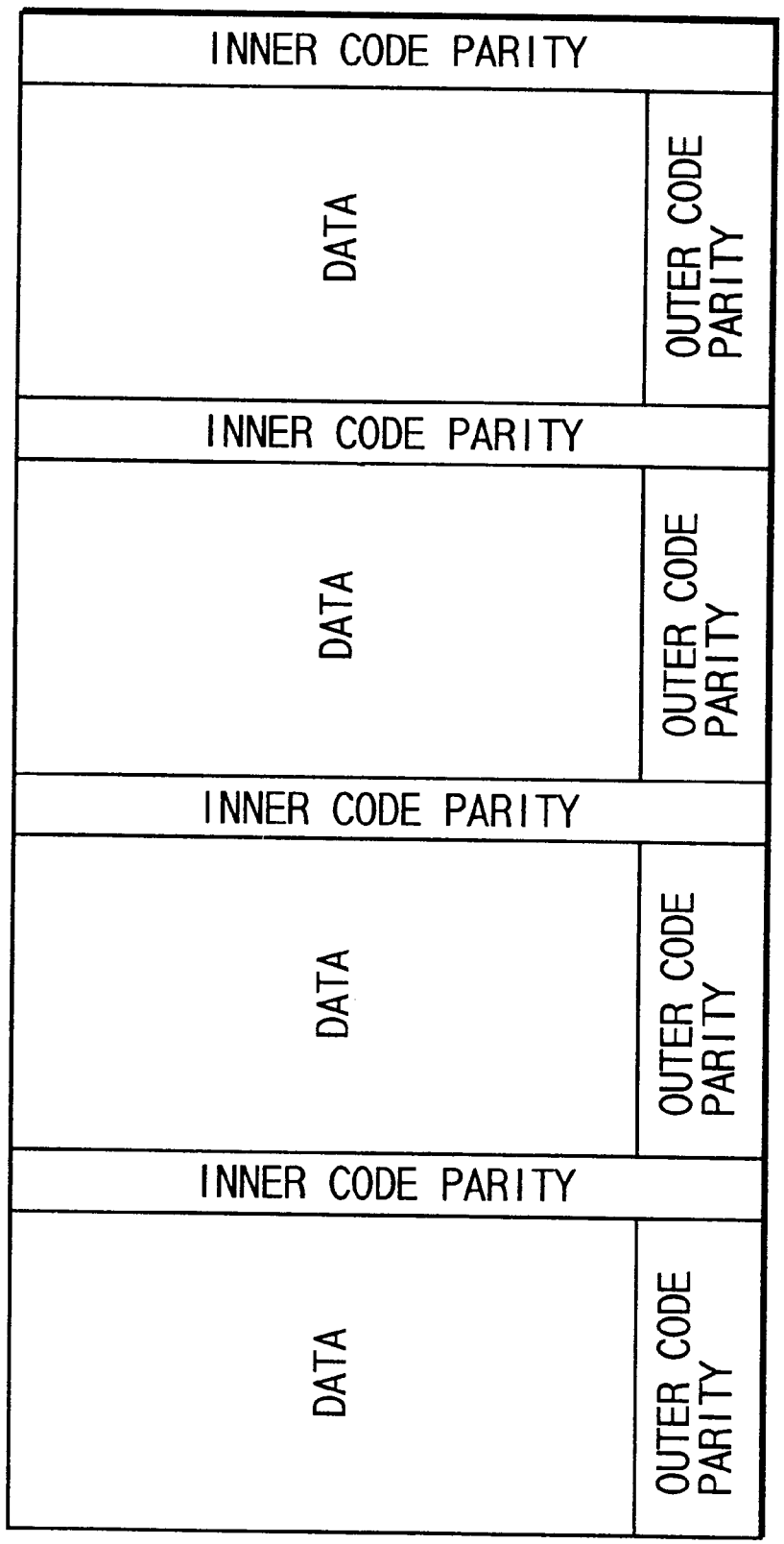
FIG. 1 shows a conventional error correction block.
Figure 2A:
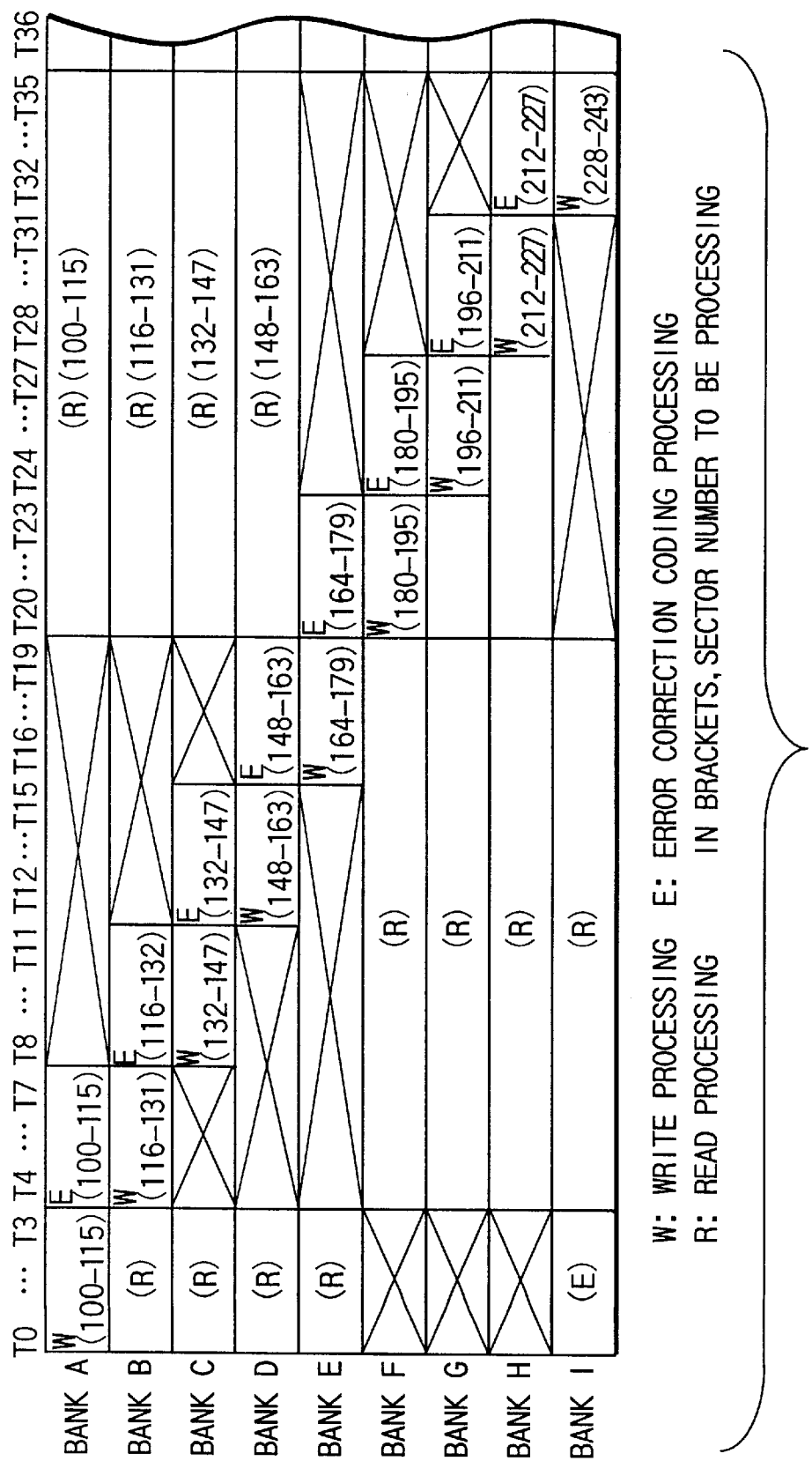
FIGS. 2A and 2B show a conventional four block interleave method.
Figure 2B:
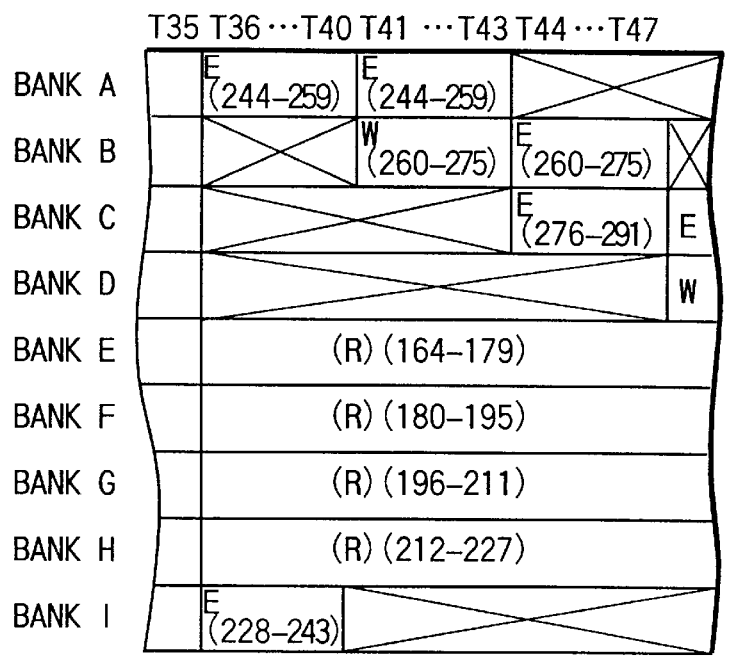

Hereinafter, the embodiment of the present invention will be explained in detail with reference to the drawing.

Here, the embodiment in which the present invention is applied to the optical disk drive will be explained. The digitized picture signal and the audio signal, the various digital data treated in the computer can be recorded to the optical disk.

Figure 3:
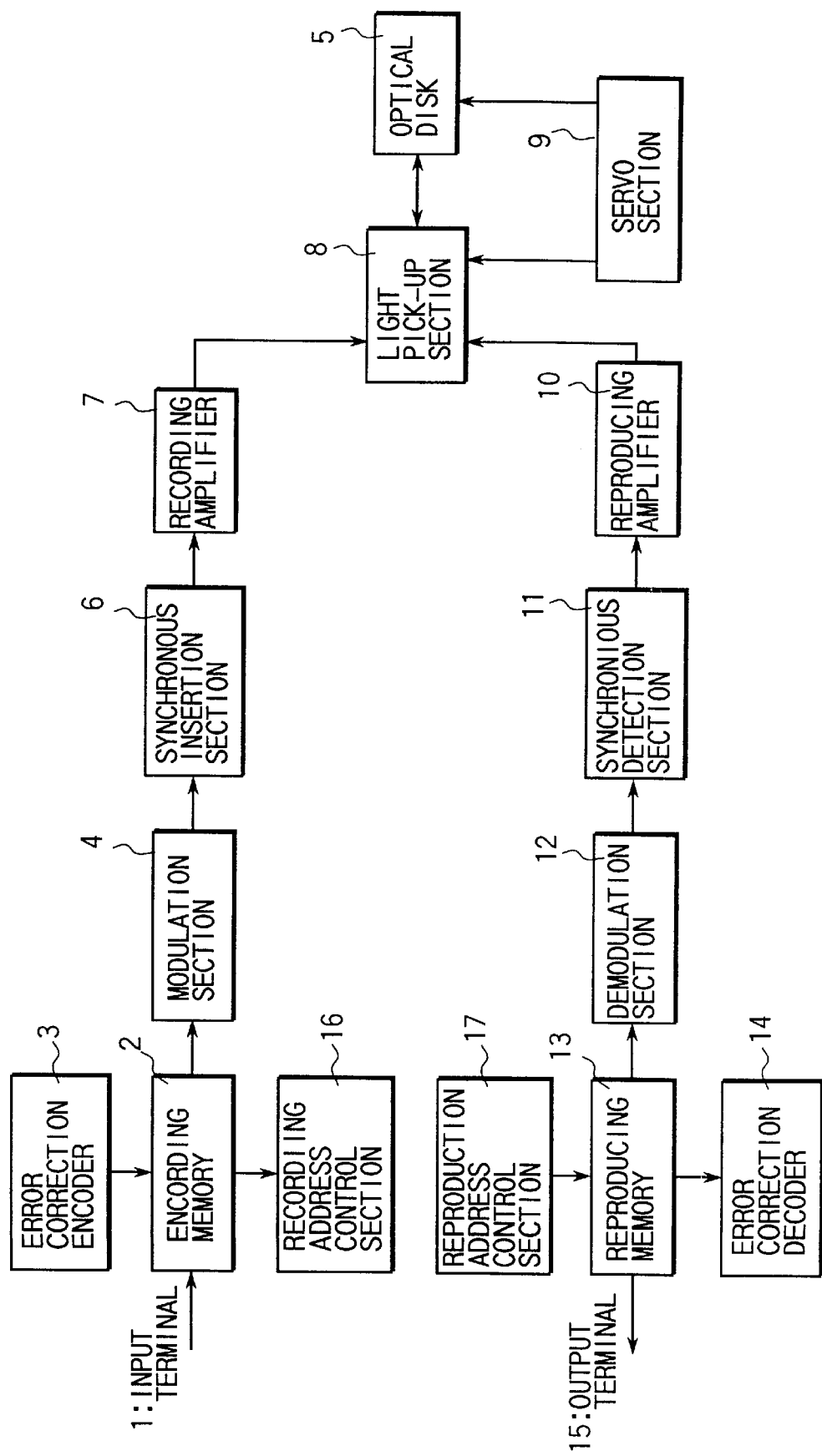
FIG. 3 shows the block structure of the digital optical disk drive.

FIG. 3 shows a block structure of the optical disk drive.

The input data to be recorded is input from the input terminal 1 as the digital data. The input data is treated by the predetermined size which is called a sector as a unit. The input data is once written into a recording memory 2 with the auxiliary information which is added every sector and so on. Next, the data in the recording memory 2 is read and is performed the coding processing of an error correction code by a correction encoder 3. The check parity generated by the coding processing is added to the recording memory 2.

Thereafter, the data in performing the error correction coding is read from the recording memory 2. The reading of the data from the memory is performed by the order which is different from the writing according to the predetermined interleave method. The read data is converted to the signal form which matches the recording characteristics of a optical disk 5 in a modulation section 4. After inserting a synchronous signal by the synchronous insertion section 6 to make the reference position when reproducing to the modulation signal, a picking-up section 8 inputs the data through a recording amplifier 7. The data is recorded to the optical disk 5 by the laser signal output from the picking-up section 8.

On the optical disk 5 a recording track is formed in a shape of concentricity or spiral. A recording position to the optical disk is fixed by controlling the turn of the optical disk 5 and the position of the picking-up section 8 by a servo section 9.

The reproduction of the data recorded to the optical disk 5 is performed by the following procedure. The optical disk to be reproduced may be the read-only disk in which data is recorded when manufacturing a disk and the disk including a region capable of recording and a read-only region in addition to the recordable and reproducable optical disk.

The signal recorded to the optical disk 5 is read by the laser light by turning the optical disk 5 and controlling the picking-up section 8 by the servo section 9. The signal read by the picking-up section 8 is input to synchronous detection section 11 through reproducing amplifier 10. At synchronous detection section 11, the reference position is obtained for demodulation processing from the synchronous pattern in the reproduced signal. After restoring the read signal to the data form before modulation at demodulation section 12, the signal is written into a reproducing memory 13 once. The writing order to the reproducing memory 13 is performed according to the deinterleave method. The deinterleave processing corresponds to the inversion of the interleave processing performed in recording.

The error occurred with the influences such as the noise and the medium defect is contained in the reproduced data. A error correction decoder 14 reads the data of the reproducing memory 13, and detects and corrects errors in the reproduced data using the parity data added by the processing of the error correction coding. A right data after correction obtained by the error correction processing to the necessary data for error correction is written over the reproducing memory 13.

The data after error correction is read from the reproducing memory 13 and is output from output terminal 15 in the sector unit.

Figure 4:
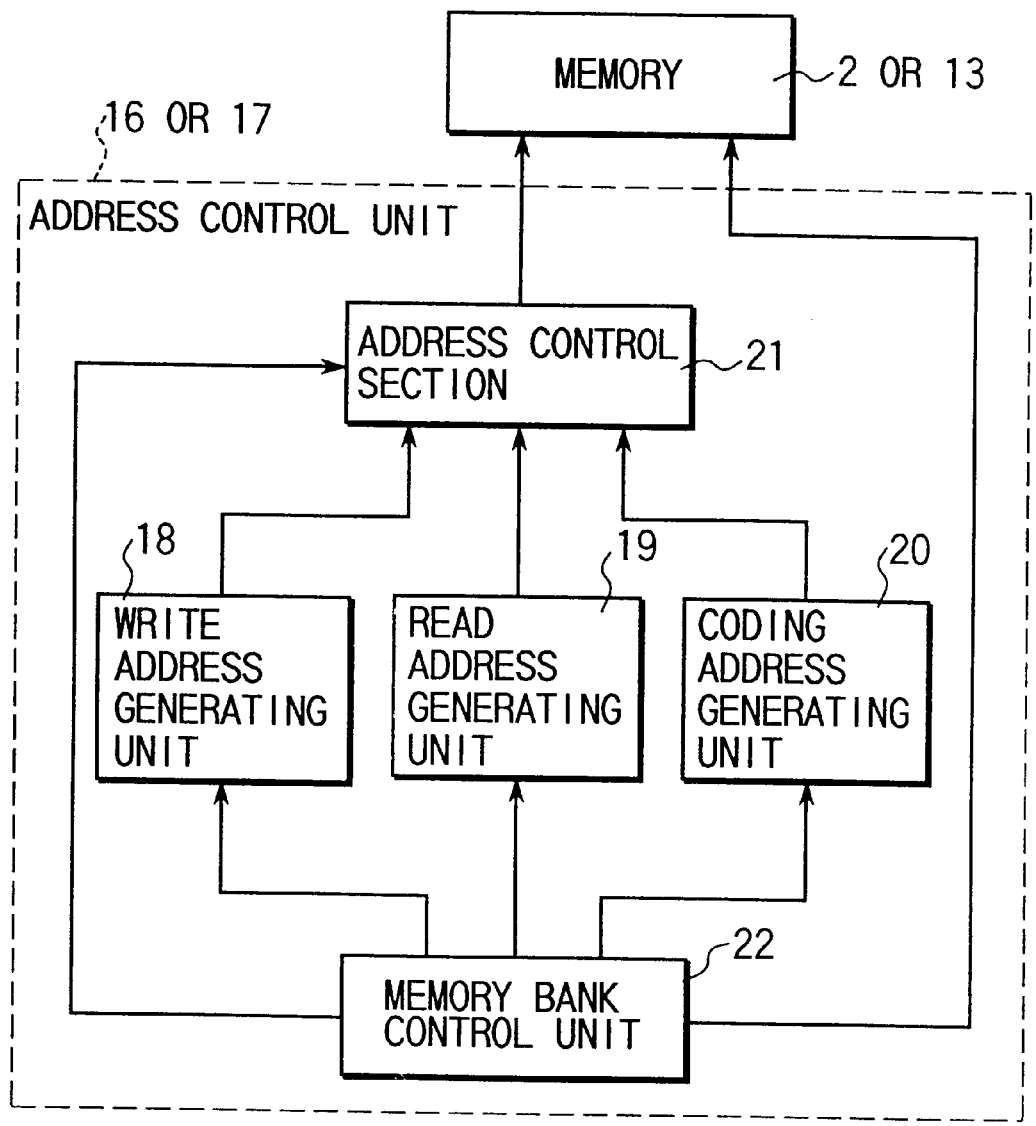
FIG. 4 shows the structure of the memory address control section.

The interleaving processing and the deinterleave processing can be realized respectively by the address control to the recording memory 2 and the reproducing memory 13. A recording address control section 16 and a reproducing address control section 17 are in the same structure. FIG. 4 shows a structure of each memory control section. The address input to the memory is generated respectively in a write address. generating section 18, a read address generating section 19, and a coding address generating section 20. The address signals output from each address generating section are in the time-division-multiplexed at an address selection section 21 and are input to the address terminal of the memory.

Memory bank control section 22 manages the correspondence of the generated address signal and the memory bank which supplies it, and supplies the time division switching signal of the address signal to the address selection section 21 and a bank switching signal to the memory 2 or 13. The generation timing of each address generating section is controlled, also, by the memory bank control section 22. Each memory is divided into the plurality of banks capable of storing one error correction block and the interleave processing and the deinterleave processing are performed by switching this bank.

The recording memory address control section 16 and the reproducing address control section 17 are in the same structure but the method of generating each address and the method of controlling a memory bank are different. Also, the deinterleave processing corresponds to the inversion of the interleave processing.

Figure 5:
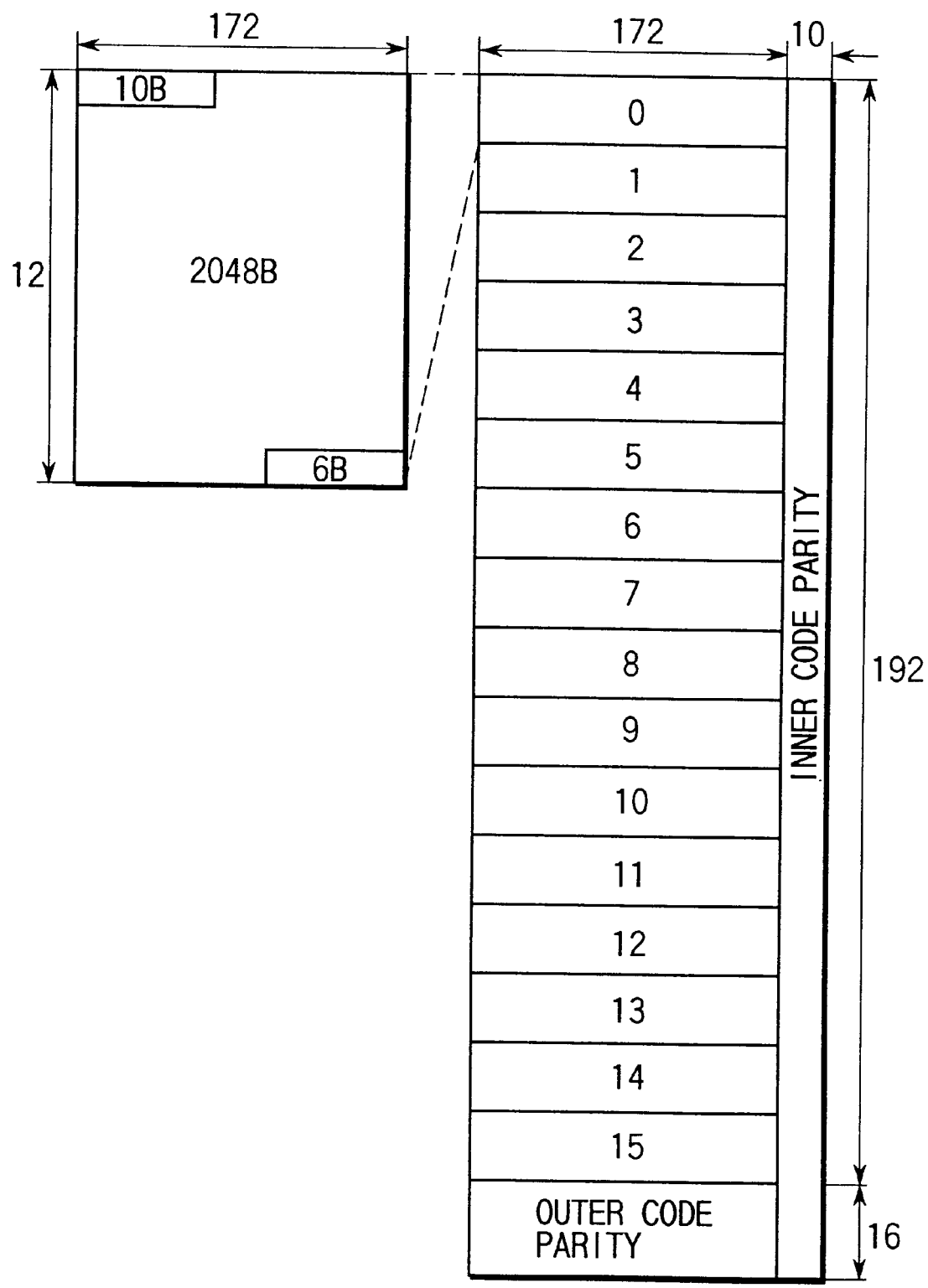
FIG. 5 shows a error correction block.

FIG. 5 shows an example of the error correction code which is coded by the error correction encoder 3. The input data is treated in the sector of the 2048-byte unit, and the data block of 2064 bytes is constituted by adding information of 16 bytes to each sector. Moreover, to perform the error correction coding, 2064-byte data is arranged in a form of 172 rows and 12 lines, to constitute a block of the 172 rows and 192 lines by arranging sixteen block of the 2064-byte data in the vertical direction.

A Reed-Solomon product code is generated for the data block constituted in this method. At first, external code is coded in the column direction. The coding of RS(208, 192, 17) code for each column data of 192 bytes is performed and a 16-byte parity is generated as an outer code parity. After coding the external code for all columns, the internal code is coded in a row direction. The coding of RS(182, 172, 11) code for each row data of 172 bytes is performed and a 10-byte parity is generated as an inner code parity. When coding the internal code for all lines, a error correction block with the 182 rows and 208 lines is finally generated.

Figure 6:
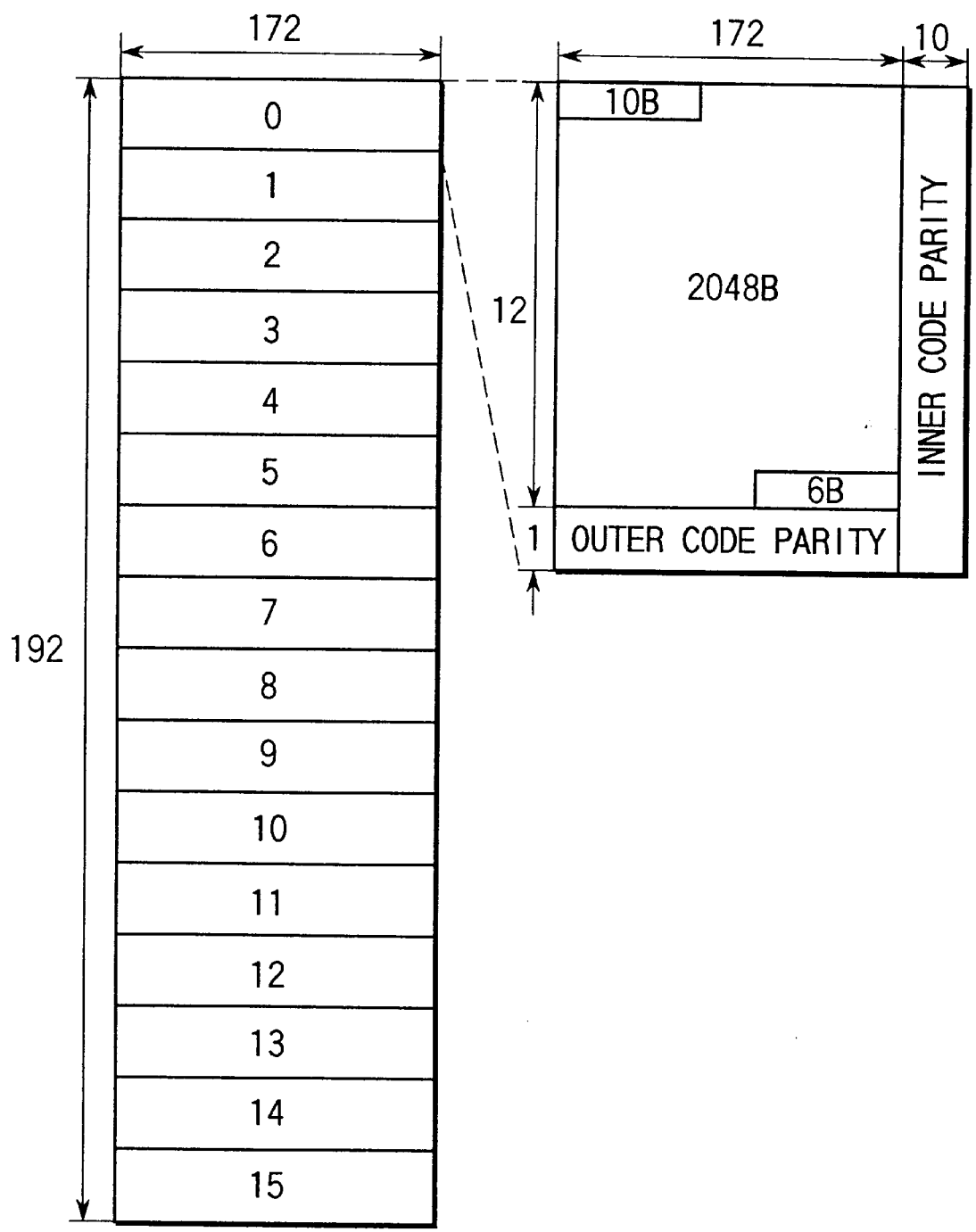
FIG. 6 shows a data format.

Moreover, the outer code parity with sixteen rows among each of the sectors is dispersed as shown in FIG. 6, sixteen sector blocks each with the 182 rows and 13 lines constitutes a data format.

The error correction code is not limited to the code shown in FIG. 5 and may be coded with at least two error correction codes for the data arranged in similar blocks.

The Reed-Solomon product code is one of the codes which are excellent for the error correction ability. Especially, there is a feature in which the error correction ability is high to the error continuously occurred (burst error). For example, in this format, if the data is taken out from the block shown in FIG. 6 one-by-one line, and is recorded in order, even if the data continuing sixteen rows in the maximum is lost by the error, it is possible to correct to the original data by the error correction processing.

The burst error occurs with the influence of the defect of the optical disk which is a medium, the garbage and the dirt which adhered to the surface thereof and so on. In case of the system in which the recording density is low, the burst error which is occurred by these factors is not so large. However, it becomes necessary to improve the burst error correction ability because the defect and the garbage with the same size cause the larger burst error when the recording density becomes high.

One method for improving the burst error correction ability of the Reed-Solomon product code is to increase the number of the outer code parities. However, the storage capacity in the whole optical disk is lowered because of lowering the rate of the input data occupied to the recorded data when increasing the outer code parity. Therefore, the interleave processing that the burst error correction ability can be improved without lowering the storage capacity.

The interleave processing is a processing data in one error correction block are dispersed in a wide range by rearranging and multiplexing the data using a plurality of error correction blocks as a set. The burst error correction ability is improved proportional to the number of the error correction blocks in the set.

Figure 7:
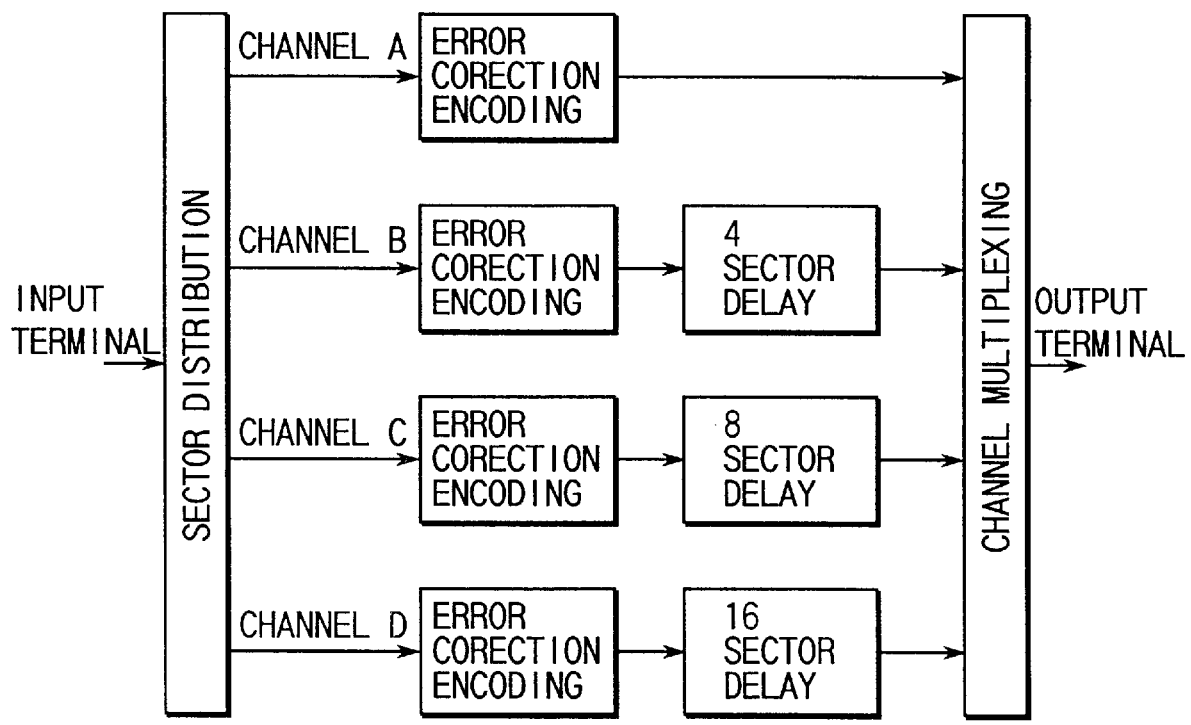
FIG. 7 shows a procedure of the four block interleave processing.

With the present invention, FIG. 7 shows a processing procedure in case of performing an interleave in four blocks. For explanation, the sector number of the ascending order by the sector unit is added to the input data in input order.

First, the input data is assigned to four channels from A to D in the sector unit. For example, the data of sixteen sectors of sector number from 100 to 115 are assigned to the channel A and assigned channels of the following data are switched in order of B, C, D, A for every sixteen sectors. A method of assigning to the channel is not limited to this example. For example, a sector number 100 is assigned to the channel A and thereafter assigned channel may be switched for every one sector in order of C, D, A, B.

Figure 8:
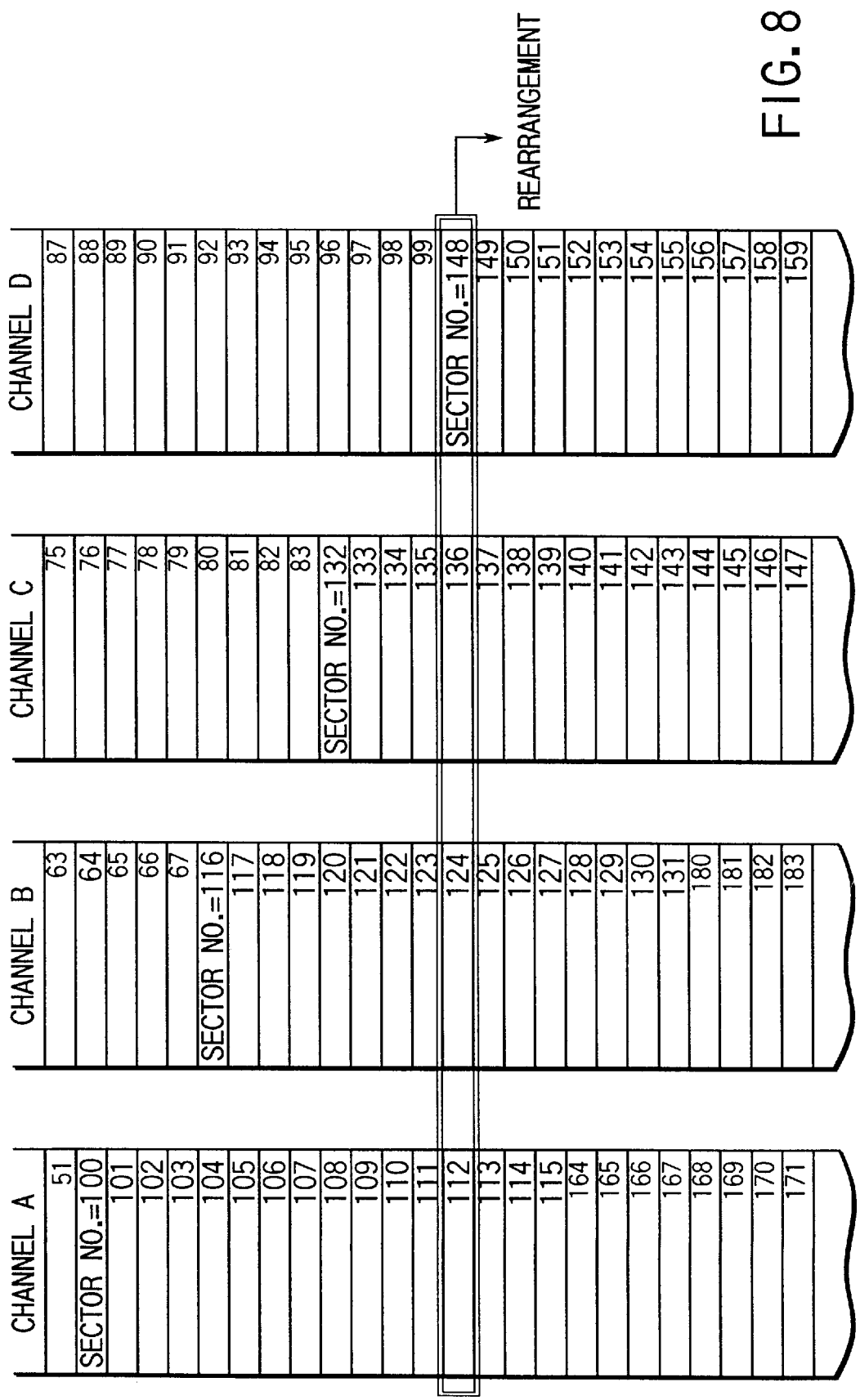
FIG. 8 shows the data arrangement after offset processing in case of the four block interleave.

The error correction coding is performed according to the error correction code shown in FIG. 5 by the sixteen sector unit every channel. To generate the parity, the data of each channel is read sequentially after performing an error correction coding. The delay according to the channel is added to the read data and an offset is given to the output timing of the data. The offset between the channels is that the integer times of which the read time of the data for one correction block is divided, for example, by the number of the channels. Here, the offset is set as the period corresponding to the four sectors which corresponds to the quarter of sixteen sectors. FIG. 8 shows the timing after end of offset.

Data multiplexing is performed among channels by setting total four sectors of one sector of each channel arranged in the horizontal direction as a unit by the data with the form shown in FIG. 8. For example, the data is read with being rearranged among total four sectors of sector numbers 112, 124, 136, 148 and is output. A multiplexing processing is often performed by the one-byte unit and the one row unit in the error correction block. FIG. 9 shows a data series after interleave processing when being rearranged by the one row unit.

Since data in the identical error correction block is dispersedly recorded to four times of ranges when an interleave is performed in four blocks, the burst error correction ability is four times strengthened to the interleaved data.

Figure 10:
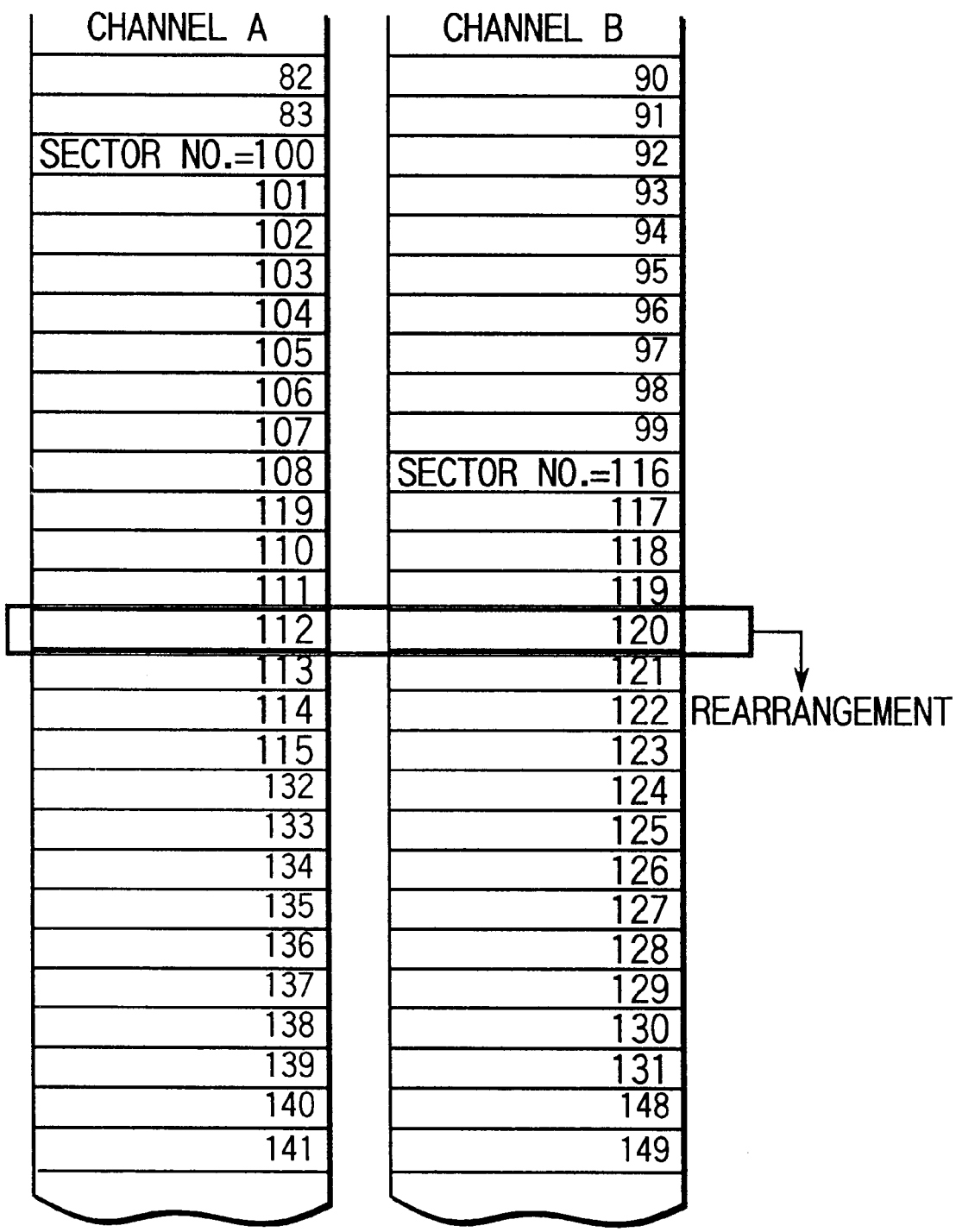
FIG. 10 shows a data series after offset processing in case of the two block interleave.

It FIG. 10 and FIG. 11 show data series after the offset and the interleave when the interleave is performed in two blocks in the same method respectively. In case of the two block interleave, the offset between the channels becomes with the period corresponding to eight sectors. It does the multiplexing of the data during two channels arranged in the horizontal direction like the case of the four sector interleave. For example, rearrangement is performed in sector numbers 112 and 120.

In FIG. 7, for the explanation of the interleave processing, an error correction encoder and a sector delay section are provided for each channel, but these sequential processings can be realized by the memory and one error correction encoder as shown in FIG. 3.

According to the present invention, FIG. 12 shows an example of the interleave processing to the recording memory when the interleave is performed in four blocks. Each bank has a capacity which can store one error correction block and is divided into the subbanks with the capacity of the quarter thereof respectively.

The input data is written into the memory with changing a bank in order every sixteen sectors. Writing to the bank A in order from the data with sector number 100 at period T0 is started. The writing data is written to the four subbanks every four sectors in the order. When data of sixteen sectors constituting one error correction block is written into the bank A, the error correction coding processing is started to the data sector numbers from 100 to 115 written into the bank A from period T4. At the same time, a bank of the writing of the input data is switched to the bank B.

When the error correction coding processing of bank A is completed, the error correction coding processing is switched to the bank B from period T8 and the writing bank of the input data is switched to the bank C. At the same time, read of the data in which an error correction coding is performed is started from the memory with performing the interleave. To perform a four block interleave, the data is read in parallel from the other three banks in addition to the bank A where coding has been completed in the past and is maintained by the memory. Since the error correction coding processing of bank B is completes in period T11, a reading from bank B is started from period T12. As a result, the offset corresponding to the four sectors occurs at the read starting timing for every banks.

Hereinafter, the processing is forwarded in order with changing a bank in the same method.

The writing of the input data to the bank A needs a periods from T0 to T3, but the reading of the output data, as a result of the interleave, requires four times of periods from period T8 to T23. The new data can not be written into each bank until the output of the data is completed. Therefore, new input data can be written into the bank A at period T24 or later. As a result, the number of the banks which is necessary for the interleave processing of four blocks becomes equal to or more than six.

When taking notice of one period, write processing is performed at one bank, an error correction coding is performed at one bank, and read processing is performed at four banks at the same time. It finds that the bank which is not processing does not exist and that a memory is efficiently used.

Since it is necessary that the error correction coding processing must code two types codes of the internal code and the external code for the error correction block, it is necessary to generate the parity with twice reading speed of writing speed and write back the result to the memory. When coding at the same speed as the writing, twice of time is required for coding processing. In the case, one number of the banks which is necessary for an interleave processing increases.

Figure 13:
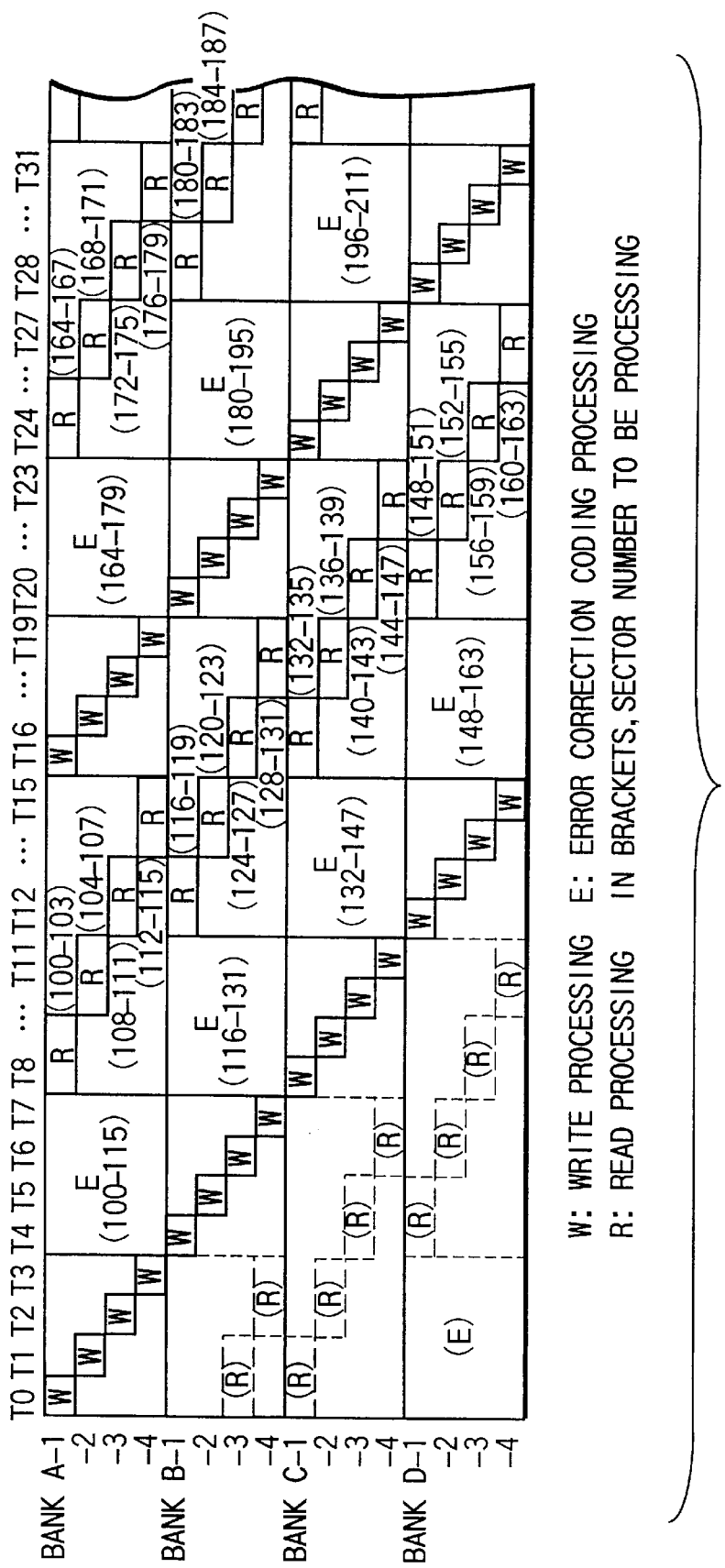
FIG. 13 shows interleave processing to the recording memory in case of the two block interleave.

FIG. 13 shows an example when the interleave is performed in two blocks in the same method.

When taking notice of the processing of the bank A, the writing of the data with sector number 100 to the memory is started from period T0. The error correction coding processing starts from period T4 and the data is read with performing the interleave in period T8. Since the interleave is performed in two blocks, the time required for reading becomes a half in case of the four block interleave. Therefore, it is possible to use for the writing of the input data again from period T16. As a result, the number of the banks which is necessary to performing the two block interleave processing is equal to or more than four.

The offset between the channel reading the interleaved data is equal to the four block interleave in an absolute time conversion, but becomes a half in case of the four block interleaving when converting to the time which reads data from each bank and the amount of read data.

Next, on the reproducing side, the deinterleave processing to return the interleaved data to the origin is performed. The deinterleave processing can be realized by the memory and one error correction decoder as shown in FIG. 1.

Figure 14:
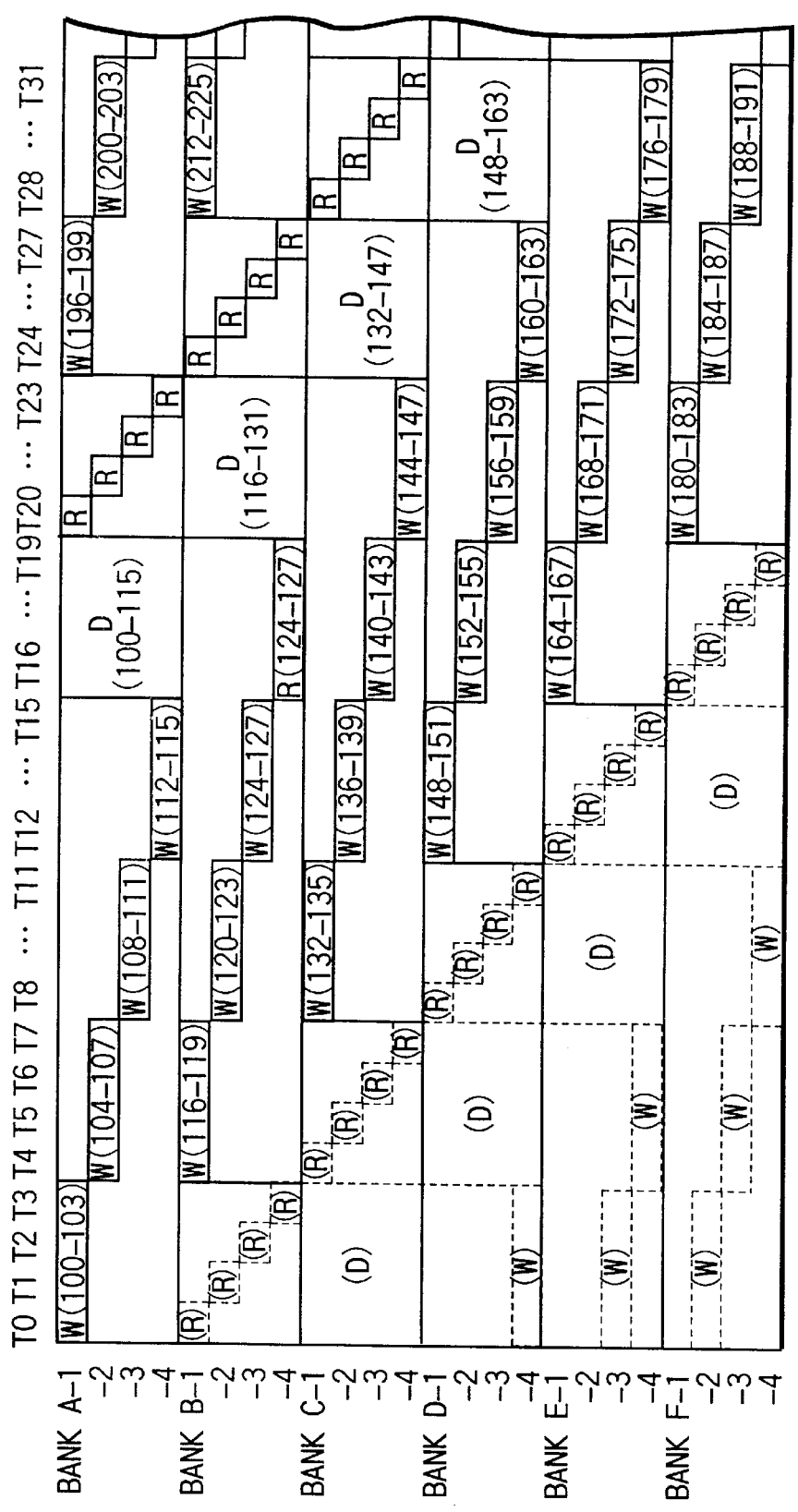
FIG. 14 shows deinterleave processing to the reproducing memory in case of the four block interleave.

FIG. 14 shows an example of the deinterleave processing when reproducing the interleaved data for four blocks. Each bank has a capacity capable of storing one error correction block like the recording memory and each bank is divided into the subbank with the capacity of the quarter thereof respectively.

The reproduced data is reproduced by the order shown in FIG. 9 by the interleave processing at recording. This data is restored to the data series in the order of the original sector number by the deinterleave processing.

It supposes that the reproducing of the data including the sector number 100 is started in period T0. Since the data is interleaved in four blocks, the data to be reproduced in period T0 is multiplexed by the data of three sectors which has been previously reproduced in addition to the data with sector number 100. When writing to the memory, the multiplexed data according to the interleave method is separated and is written into four banks for every sector. It supposes that data with sector number 100 is written into the bank A.

When writing data to be reproduced in the memory in order, the reproducing of the data including sector number 116 is started in period T4. The data of sector number 116 is written into the bank B. The reproducing of the data including sector number 132 is started in period T8. The data of sector number 132 is written into the bank C.

When writing data to be reproduced into the memory in this method, the four-block interleaved data becomes the same as a case that the offset for each channel is given. The offset between the channels is an integer times of which the read time of the data for one correction block is divided, foe example, by the number of the channels. Here, the offset is set as the period corresponding to the four sectors which corresponds to the quarter of sixteen sectors.

When the writing to the memory is advanced in order, the sixteen sector data of sector number from 100 to 115 constituting one error correction block are made up to the bank A at period T15. Therefore, the error correction decoding processing to the data of the A bank is started from period T16. In parallel with the error correction decoding processing of the bank A, the reproduced data is sequentially written from banks B to E.

When the error correction decoding processing by bank A is completed, the error correction decoding processing is switched from the bank A to the bank B at period T20. The writing of the data to be is switched to the four banks of from the bank C to the bank F. The error corrected data of the bank A is read in order of the sector number and is output. Since the error correction decoding processing of the bank B is completed at period T23, the reading of the data is switched to the bank B at period T24.

Hereinafter, the processing is advanced in order with changing the banks in the same method.

Since the interleave processing is preformed, the writing of reproduced data to the bank A needs periods from period T0 to T15, but the reading can be performed a quarter period from T20 to T23 thereof since the reading can be executes at four times in speed thereof. The error correction decoding processing of the bank A is started at period T16 or later, since the error correction decoding processing can not be started when the writing of the data constituting one error correction block is not completed. Therefore, the new data to be reproduced can be written into the bank A becomes at period T24 or later. As a result, the number of the banks which is necessary for the four blocks deinterleave processing becomes equal to or more than six.

When taking notice of one period, the writing processing is performed at four banks, the error correction processing is performed at one bank, and the read processing is performed at one bank at the same time. It finds that the bank which is not processing does not exist and that a memory is efficiently used.

Figure 15:
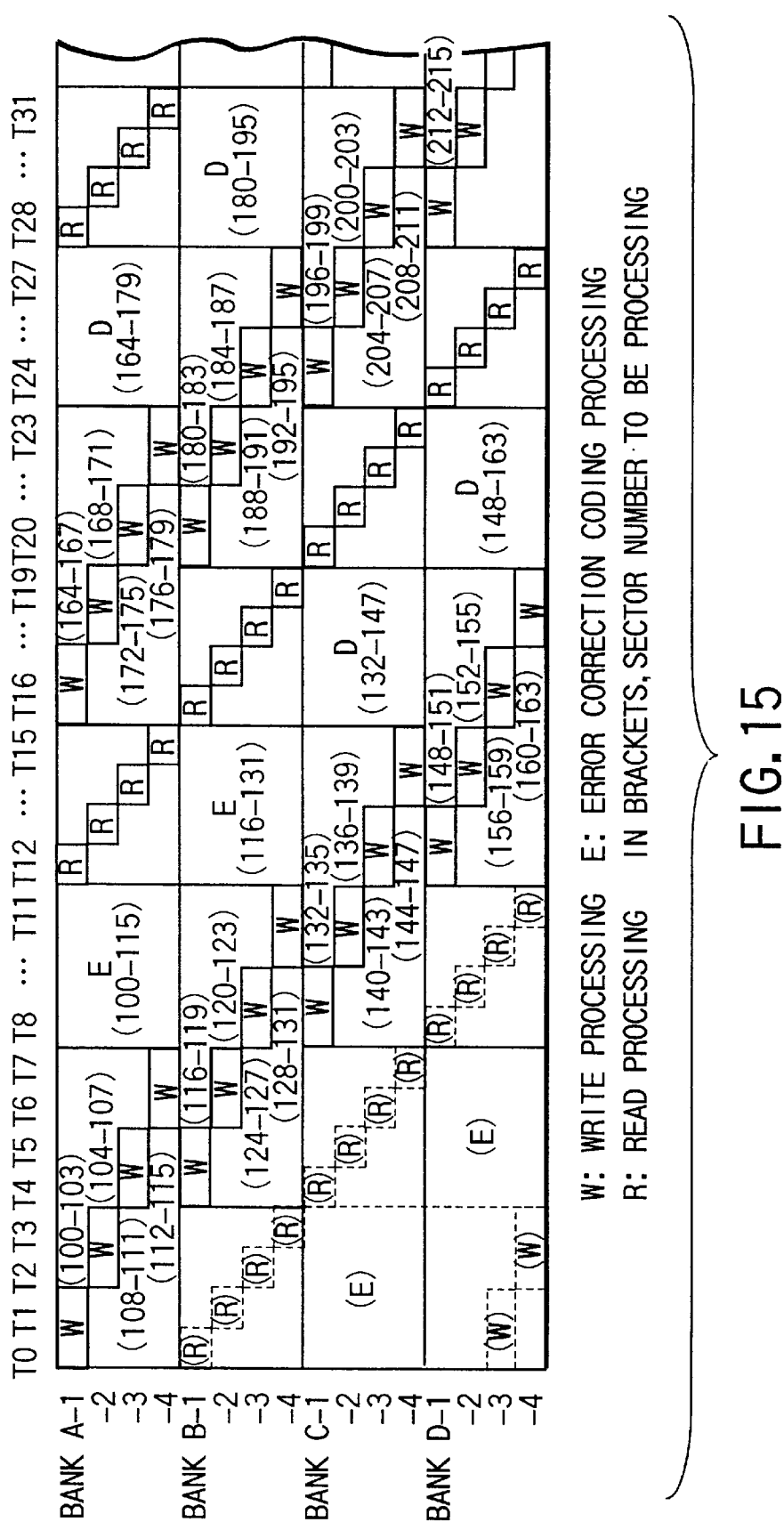
FIG. 15 shows deinterleave processing to the reproducing memory in case of the two block interleave.

FIG. 15 shows an example of the deinterleave processing when reproducing the interleaved data for tow blocks.

When taking notice of the processing of the bank A, the writing of the data with sector number 100 to the memory is started from period T0. Since two block deinterleave are performed, the writing of the data sector number from 100 to 115 constituting an error correction block becomes a half in case of the four block interleave. Therefore, the error correction decoding processing of the bank A is started from period T8. The reading of the output data is started from period T12 and is ended at period T15. Therefore, the bank A can be used for the writing of the data to be reproduced again from period T16. As a result, the number of the banks which is necessary for the deinterleave processing to the two-block interleaved data becomes equal to or more than four.

According to the present invention, when performing interleave processing to a plurality of error correction block, the memory which is necessary for the interleave and the deinterleave processing can be reduced by adding an offset between the channels to be interleaved.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An error correction coding method comprising:
    dividing an input data stream into first data blocks, each having a predetermined size;
    forming second data blocks, each including a plurality of first data blocks combined in a continuous manner;
    (i) encoding the second data blocks with an outer code in order to form outer code parity portions, each being arranged along a first boundary of each second data block and (ii) encoding the second data blocks and the outer code parity portions with an inner code in order to form inner code parity portions, each being arranged along a second boundary of each second data block, the first and second boundaries being adjacent;
    forming third data blocks, each having a predetermined number of rows, the third data blocks being formed of a combination of the second data blocks, the outer code parity portions, and the inner code parity portions;
    assigning each third data block to a different data channel, each assigned third data block being shifted in time from the other assigned third data blocks by an integer multiple of a timing offset;
    producing at least one row unit, the at least one row unit being formed by linking common rows from the predetermined number of rows, the linking being in accordance with the timing offset; and
    multiplexing the third data blocks in accordance with the at least one row unit in order to produce an interleaved output data stream having a predetermined length.

2. A error correction coding method according to claim 1, wherein said offset is an integer times of a time in which the required time for reading data of said third block is divided by the number of the channels.

3. An error correction coding apparatus comprising:
    means for dividing an input data stream into first data blocks, each having a predetermined size;
    means for forming second data blocks, each including a plurality of first data blocks combined in a continuous manner;
    means for (i) encoding the second data blocks with an outer code in order to form outer code parity portions, each being arranged along a first boundary of each second data block and (ii) encoding the second data blocks and the outer code parity portions with an inner code in order to form inner code parity portions, each being arranged along a second boundary of each second data block, the first and second boundaries being adjacent;
    means for forming third data blocks, each having a predetermined number of rows, the third data blocks being formed of a combination of the second data blocks, the outer code parity portions, and the inner code parity portions;
    means for assigning each third data block to a different data channel, each assigned third data block being shifted in time from the other assigned third data blocks by an integer multiple of a timing offset;
    means for producing at least one row unit, the at least one row unit being formed by linking common rows from the predetermined number of rows, the linking being in accordance with the timing offset; and
    means for multiplexing the third data blocks in accordance with the at least one row unit in order to produce an interleaved output data stream having a predetermined length.

4. An error correction coding apparatus according to claim 3, wherein said offset is an integer times of a time in which the required time for reading data of said third block is divided by the number of the channels.

5. A data recording apparatus comprising:
    a memory for temporarily storing data;
    error correction coding means for performing an error correction coding of said data; and recording means for recording a data series in which an error correction coding is performed to a recording medium, wherein said error correction coding means comprises:

means for dividing an input data stream into first data blocks, each having a predetermined size;

means for forming second data blocks, each including a plurality of first data blocks combined in a continuous manner;

means for (i) encoding the second data blocks with an outer code in order to form outer code parity portions, each being arranged along a first boundary of each second data block and (ii) encoding the second data blocks and the outer code parity portions with an inner code in order to form inner code parity portions, each being arranged along a second boundary of each second data block, the first and second boundaries being adjacent;

means for forming third data blocks, each having a predetermined number of rows, the third data blocks being formed of a combination of the second data blocks, the outer code parity portions, and the inner code parity portions;

means for assigning each third data block to a different data channel, each assigned third data block being shifted in time from the other assigned third data blocks by an integer multiple of a timing offset;

means for producing at least one row unit, the at least one row unit being formed by linking common rows from the predetermined number of rows, the linking being in accordance with the timing offset; and means for multiplexing the third data blocks in accordance with the at least one row unit in order to produce an interleaved output data stream having a predetermined length.

6. The data recording apparatus according to claim 5, wherein an offset L-th system (L is an integer of 0 to M−1) is set to L·M/N.

7. A data recording apparatus according to claim 5, wherein said offset is an integer times of a time in which the required time for reading data of said third block is divided by the number of the channels.

8. The data recording apparatus according to claim 7, wherein an offset L-th system (L is an integer of 0 to M−1) is set to L·M/N.

9. A recording medium according to claim 7, wherein said offset is an integer times of a time in which the required time for reading data of said third block is divided by the number of the channels.

10. A recording medium comprising a program which is readable by the computer, said program executing:

dividing an input data stream into first data blocks, each having a predetermined size;

forming second data blocks, each including a plurality of first data blocks combined in a continuous manner;

(i) encoding the second data blocks with an outer code in order to form outer code parity portions, each being arranged along a first boundary of each second data block and (ii) encoding the second data blocks and the outer code parity portions with an inner code in order to form inner code parity portions, each being arranged along a second boundary of each second data block, the first and second boundaries being adjacent;

forming third data blocks, each having a predetermined number of rows, the third data blocks being formed of a combination of the second data blocks, the outer code parity portions, and the inner code parity portions;

assigning each third data block to a different data channel, each assigned third data block being shifted in time from the other assigned third data blocks by an integer multiple of a timing offset;

producing at least one row unit, the at least one row unit being formed by linking common rows from the predetermined number of rows, the linking being in accordance with the timing offset; and multiplexing the third data blocks in accordance with the at least one row unit in order to produce an interleaved output data stream having a predetermined length.

11. An error correction decoding method comprising the steps of:

dividing data into a plurality of blocks to write into a memory and reading a data block generated by performing an error correction coding to add a check parity by adding an offset according to a number of channels of said channels to prepare a recording medium recording a data series formed by multiplexing read said data in a predetermined unit;

writing data read from said recording medium into the memory by dividing into a plurality of channels in a predetermined unit;

generating a first block from written said data;

performing error detection and correction by decoding at least two types of error correction codes in a unit of said first block for every said channel to generate a second block; and reading and outputting data in said second block in order from said memory for each of said plurality of channels based on said offset with making a third data block a unit.

12. An error correction decoding method according to claim 11, wherein said offset is an integer times of a time in which the required time for reading data of said third data block is divided by the number of the channels.

13. An error correction decoding apparatus for performing an error correction decoding of read data from a recording medium recording a data series formed by dividing data into a plurality of blocks to write into a memory and reading a data block generated by performing an error correction coding to add a check parity by adding a different offset for each of said plurality of channels and recording a data series formed by multiplexing read said data in a predetermined unit to said recording medium, comprising:

means for writing data read from said recording medium into the memory by dividing into a plurality of channels in a predetermined unit;

means for generating a first block from written said data;

means for performing error detection and correction by decoding at least two types of error correction codes in a unit of said first block for every said channel to generate a second block; and means for reading and outputting data in said second block in order from said memory for each of said plurality of channels based on said offset with making a third data block a unit.

14. An error correction decoding apparatus according to claim 13, wherein said offset is an integer times of a time in which the required time for reading data of said third data block is divided by the number of the channels.

15. A data reproducing apparatus comprising error correction decoding means for performing an error correction decoding of read data from a recording medium recording a data series formed by dividing data into a plurality of blocks to write into a memory and reading a data block generated by performing an error correction coding to add a check parity by adding a different offset for each of said plurality of channels and recording a data series formed by multiplexing read said data in a predetermined unit to said recording medium, wherein said error correction decoding means comprises:

means for writing data read from said recording medium into the memory by dividing into a plurality of channels in a predetermined unit;

means for generating a first block from written said data;

means for performing error detection and correction by decoding at least two types of error correction codes in a unit of said first block for every said channel to generate a second block; and means for reading and outputting data in said second block in order from said memory for each of said plurality of channels based on said offset with making a third data block a unit.

16. The data reproducing apparatus according to claim 15, wherein an offset L-th system (L is an integer of 0 to M−1 is set to L·M/N.

17. A data reproducing apparatus according to claim 15, wherein said offset is an integer times of a time in which the required time for reading data of said third data block is divided by the number of the channels.

18. The data reproducing apparatus according to claim 17, wherein an offset L-th system (L is an integer of 0 to M−1) is set to L·M/N.

\* \* \* \* \*